United States Patent [19]

Reising et al.

[11] Patent Number: 5,669,652
[45] Date of Patent: Sep. 23, 1997

[54] APPARATUS FOR GRIPPING A FLAT SUBSTRATE

[75] Inventors: Michael Reising, Mömbris; Stefan Kempf, Alzenau; Michael König, Frankfurt, all of Germany

[73] Assignee: Balzers und Leybold Deutschland Holding AG, Hanau, Germany

[21] Appl. No.: 691,138

[22] Filed: Aug. 1, 1996

[30] Foreign Application Priority Data

Aug. 16, 1995 [DE] Germany .......... 195 29 945.0

[51] Int. Cl.⁶ ................................ B25J 15/10
[52] U.S. Cl. ............... 294/88; 294/97; 335/276; 901/36
[58] Field of Search ............. 294/65.5, 88, 93, 294/95, 97, 106; 901/36; 335/276

[56] References Cited

U.S. PATENT DOCUMENTS 3,253,853  5/1966  Loyer et al. ............... 294/88

FOREIGN PATENT DOCUMENTS

| | | |
|---|---|---|
| 2657992 | 9/1977 | Germany . |
| 9307263.5 | 9/1993 | Germany . |
| 4213764 | 10/1993 | Germany . |
| 428622 | 1/1992 | Japan . |
| 4182223 | 6/1992 | Japan . |
| 4217514 | 8/1992 | Japan . |
| 5262430 | 10/1993 | Japan . |
| 1007-968 | 3/1983 | U.S.S.R. .......... 294/88 |
| 1090-548 | 5/1984 | U.S.S.R. .......... 294/88 |
| 1452-930 | 1/1989 | U.S.S.R. .......... 294/88 |

OTHER PUBLICATIONS

Abele, "Industrieroboter in der Montage" Technische Rundschau 26/85, S. 26, 28–31, 33, no date.

*Primary Examiner*—Dean Kramer
*Attorney, Agent, or Firm*—Felfe & Lynch

[57] ABSTRACT

Several finger-like grippers (4) are held and guided in openings or holes (21) in the head part (6) of a housing (20) so they can pivot about axes which are in a common plane transverse to the longitudinal axis (L) of the housing (20). Permanent magnets (11, 12) fixed to the inner ends of the grippers (4) cooperate with an electromagnet (13) provided in the housing (20) above the magnets (11, 12), the magnetic field axis of the electromagnet coinciding with the longitudinal axis (L) of the housing (20). The electromagnet moves the inner ends of the grippers (11, 12) back and forth between two stops (16, 17) depending on the polarity of the electromagnet (13).

5 Claims, 1 Drawing Sheet

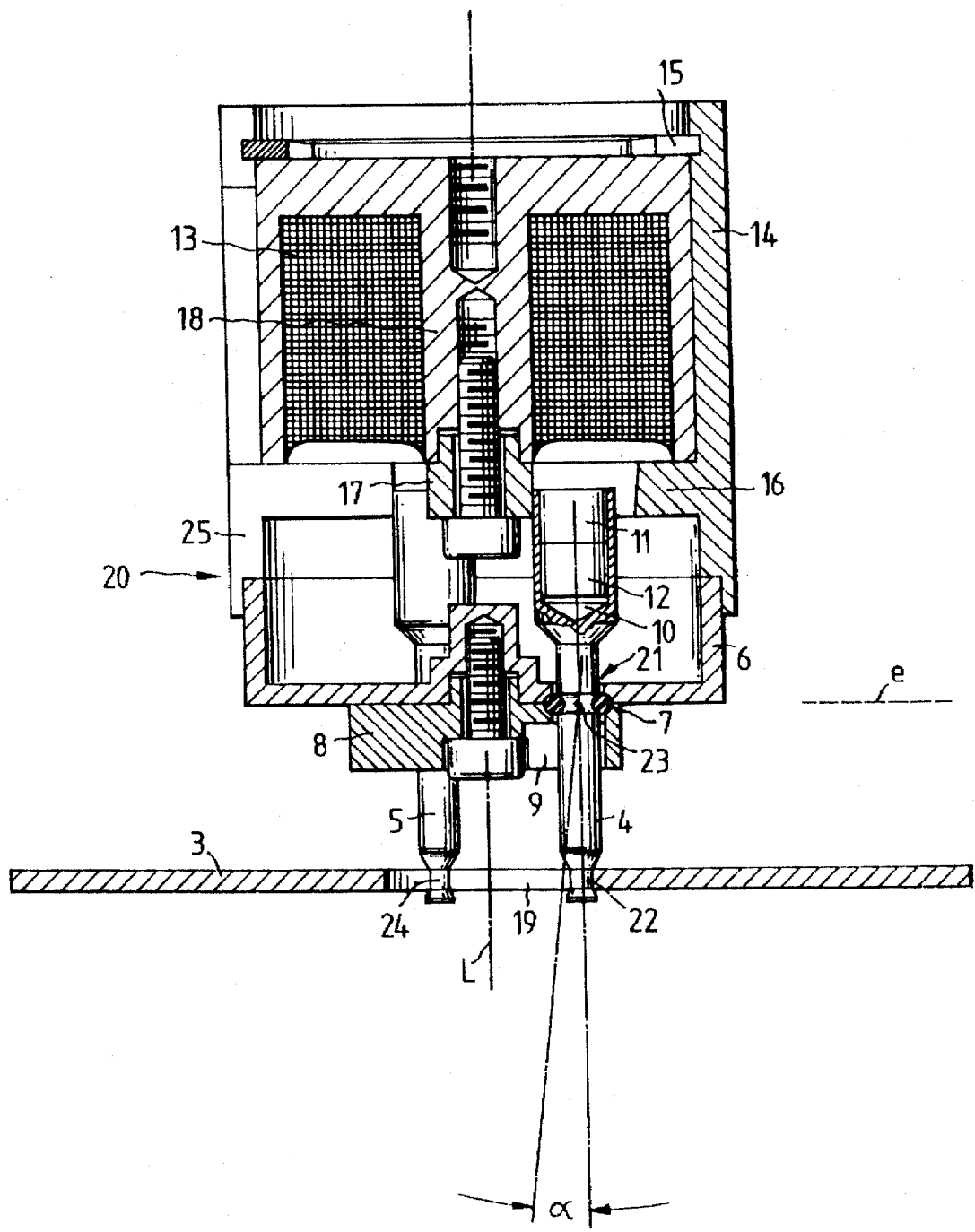

APPARATUS FOR GRIPPING A FLAT SUBSTRATE

BACKGROUND OF THE INVENTION

The invention pertains to a device for gripping and holding a flat preferably disk-shaped substrate with a central opening, such as a compact disc. The apparatus has several finger-like grippers supported in a housing in such a way that they can tilt, the grippers being held in openings or holes in the head part of the housing, which allow the grippers to tilt around axes transverse to the longitudinal axis of the housing.

In vacuum processing technology, especially in thin-layer technology, the coating of circular disk-shaped substrates such as glass or aluminum disks for magnetic or magneto-optic data storage media is known. These disk-like substrates are widely used as storage media for digital information. A sputtering process, for example, is used to coat pressed plastic disks with layer of aluminum. The sputter coating systems used for this purpose usually have an automated handling device to transport the substrates in front of, in, and behind a vacuum chamber.

A pivot arm of a handling system, for example, transports the substrates from a buffer into the vacuum chamber. In the chamber, the substrates are laid on a rotating table and moved together with it through the individual stations of the vacuum chamber. Numerous devices for gripping and holding are known according to the state of the art to load the substrates onto, and to unload them from, the rotating table.

The grippers usually used in the vacuum chambers of the current type are actuated from outside the chamber by means of a vacuum slide channels.

These known devices suffer from the disadvantage that they usually contain too many moving parts. As a result of the sliding movements in the slide channels, undesirable particles are produced, which later find their way into the coating space, where they have negative effects on the result of the coating operation. In addition, the seals of slide channels of this type usually show wear after a certain period of time, and this wear always results in leakage from the vacuum chamber and thus to the need for expensive and time-consuming repairs.

A device has already been proposed (G 93 07 263.5) for gripping and holding a flat, preferably disk-shaped substrate, consisting essentially of several grippers and a membrane of elastic material, which closes an opening provided in a pressure-tight housing. Different pressures can be produced in front of and behind the membrane, and the membrane is installed in such a way that, when the pressures are different, the membrane moves out of its rest position and, when the pressures on both sides are the same, the membrane is returned to its rest position again by a compression spring. One end of each gripper is connected mechanically to the membrane in such a way that the other, free end executes a pivoting motion proportional to the excursion of the membrane to grip and hold or to release the substrate.

SUMMARY OF THE INVENTION

The object of the present invention is to provide an inexpensive apparatus which makes it possible to grip and to hold substrates inside and outside vacuum chambers in an especially quick and reliable manner, which apparatus can be driven electrically.

According to the invention the grippers are held and guided in openings or holes in the head part of the housing, the openings allowing the grippers to tilt around axes which are transverse to the longitudinal axis of the housing. The pivot axes of all the grippers are on the same plane, and these axes form together a regular polygon surrounding the longitudinal axis. Magnets are firmly attached to the end of each gripper facing away from the substrate. These magnets cooperate with an electromagnet provided in the housing above the magnets. The magnetic field axis of this electromagnet coincides with the longitudinal axis of the housing, and, depending on its polarity, the electromagnet moves the ends of the grippers carrying the magnets back and forth between stops.

BRIEF DESCRIPTION OF THE DRAWING

The sole FIGURE is a longitudinal cross section through an apparatus according to the invention.

DETAILED DESCRIPTION OF THE PREFERRED EMBODIMENT

The apparatus includes a metal sleeve 14, which has at its bottom end three radially inward-pointing, bump-like stops 16, a head part 6 rigidly connected to metal sleeve 14, and a cover plate 8, tightly screwed to head part 6. Three holes 21 are provided in head part 6, through which the associated grippers 4 pass. Magnets 11, 12 are attached to the top ends of grippers 4, these top ends extending all the way to the area of bumps 16, whereas the bottom ends extend all the way to the plane of substrate 3. One end of electromagnet 13 rests on bumps 16 of metal sleeve 14, whereas the other end is held by a locking ring 15.

Cover plate 8 is provided with three slots 9, the major axes of which are at an angle of 120° to each other. The width of slots 9 is selected in such a way that, although grippers 4 are able to tilt by an angle $\alpha$ in the direction toward longitudinal axis L, they are nevertheless unable to move transversely to the associated major axis.

Each of grippers 4 has a groove 23, approximately half way along its length, into which an O-ring 7 of an elastomeric material is inserted. This O-ring is held in turn in a corresponding groove in head part 6 and cover plate 8, and makes it possible for grippers 4 to tilt around tilting axes located in plane e, under slight deformation of the associated O-ring 7.

At the end facing substrate 3, each gripper 4 has a notch, a depression, or a groove 22 by means of which grippers 4 are able to grip the inside edge of central opening 19; the drawing shows grippers 4 in their holding position. When the three grippers are tilted radially inward, that is, when their bottom ends are moved toward axis L, grooves 22 leave the edge area of central opening 19 and release substrate 3.

Electromagnet 13, which is held in the sleeve, cooperates with permanent magnets 11, 12 in holes 10, of grippers 4 in such a way that, depending on the direction in which the current is flowing, the top ends of grippers 4 are pulled outward to stops or bumps 16 or pulled in the opposite direction toward sleeve 17, which is screwed to inside pole 18 of electromagnet 13.

Sleeve 14 is provided in the lower edge area with recesses 25. This offers the advantage that the field lines of electromagnet 13 are concentrated in such a way that grippers 4 and their magnets 11 can be moved back and forth as quickly as possible. Inside pole 18 of electromagnet 13 is extended by a steel sleeve 17. After the device has been assembled, the north poles of permanent magnets 11, 12 are between the two sleeves 14, 17. By applying a direct voltage, the two sleeves 14, 17 are polarized (e.g., north on the outside, south on the inside). By reversing the direction of the current, the polarization is inverted, and thus the direction in which the ends of grippers move is also reversed. The north pole of the permanent magnet is repelled by the adjacent pole and attracted by the opposite pole.

Permanent magnets 11, 12 are bonded in holes in grippers 4. The walls of grippers 4 surrounding magnets 11, 12 have the effect that the permanent magnetic force of the permanent magnets acting toward pole shoes 16, 17 of steel is greater than the force of repulsion between permanent magnets 11, 12 and electromagnet 13. The device described can be driven by means of individual pulses, because permanent magnets 11, 12 hold grippers 4 firmly in the end positions (at one of 16 or 17), so the electromagnetic field is only needed for switching.

What is claimed is:

1. Apparatus for gripping a disk-like substrate having a central opening, said apparatus comprising a housing having a longitudinal axis, inner stop surfaces facing outward from said axis, and outer stop surfaces facing said inner stop surfaces, a plurality of finger-like grippers pivotably supported in said housing to pivot about pivot axes in a common plane which is transverse to said longitudinal axis, each gripper having an inner end which is pivotable between one of said inner stop surfaces and one of said outer stop surfaces, and an outer end protruding from said housing, permanent magnets attached to said inner ends of said grippers, said permanent magnets serving to hold said inner ends against one of said inner stop surfaces and said outer stop surfaces, and an electromagnet having a field axis which coincides with the longitudinal axis of the housing, said electromagnet being switchable between a first polarity which moves the inner ends toward the inner stop surfaces and a second polarity which moves the inner ends toward the outer stop surfaces.

2. Apparatus as in claim 1 further comprising a metal sleeve surrounding said electromagnet, said electromagnet being situated above said permanent magnets, said metal sleeve having radially inward extending protrusions on which said outer stop surfaces are located.

3. Apparatus as in claim 1 wherein said housing comprises a head part having radial slots through which respective finger-like grippers extend between said pivot axes and said outer ends, said slots being configured to permit said grippers to pivot toward said longitudinal axis without any transverse movement.

4. Apparatus as in claim 1 wherein said inner ends of said grippers are configured as sleeves which receive said permanent magnets therein.

5. Apparatus as in claim 1 wherein said electromagnet has an inside pole concentric to said longitudinal axis, said inner stop surfaces being fixed to said inside pole.

* * * * *